(12) United States Patent
Sundaram

(10) Patent No.: US 11,990,936 B2
(45) Date of Patent: May 21, 2024

(54) REDUCED THICKNESS OPTICAL ISOLATOR AND METHOD OF USE THEREOF IN A LASER OPTIC SYSTEM

(71) Applicant: II-VI Delaware, Inc., Wilmington, DE (US)

(72) Inventor: Ramesh Sundaram, Fremont, CA (US)

(73) Assignee: II-VI Delaware, Inc., Wilmington, DE (US)

( * ) Notice: Subject to any disclaimer, the term of this patent is extended or adjusted under 35 U.S.C. 154(b) by 45 days.

(21) Appl. No.: 17/962,751

(22) Filed: Oct. 10, 2022

(65) Prior Publication Data

US 2024/0121001 A1 Apr. 11, 2024

(51) Int. Cl.
*H04B 10/2507* (2013.01)
(52) U.S. Cl.
CPC ................. *H04B 10/2507* (2013.01)
(58) Field of Classification Search
CPC .......... H04B 10/2507; H04B 10/2572
See application file for complete search history.

(56) References Cited

U.S. PATENT DOCUMENTS

| | | | | |
|---|---|---|---|---|
| 5,278,853 A * | 1/1994 | Shirai | .................. | G02B 6/2746 372/703 |
| 2004/0086256 A1* | 5/2004 | Gustavson | ............. | G02B 6/266 385/11 |
| 2005/0276615 A1* | 12/2005 | Ranganath | ........... | H04B 10/505 398/183 |
| 2017/0199401 A1* | 7/2017 | Diedrich | ................. | G02F 1/093 |
| 2018/0156976 A1* | 6/2018 | Watanabe | ............ | G02B 6/2746 |
| 2020/0379281 A1* | 12/2020 | Erhard | .................. | H01S 3/0064 |

FOREIGN PATENT DOCUMENTS

| JP | S61250612 A | 11/1986 |
|---|---|---|
| JP | H4303814 A | 10/1992 |
| JP | H5157994 A | 6/1993 |
| JP | H6160772 A | 6/1994 |
| JP | H6160773 A | 6/1994 |

(Continued)

OTHER PUBLICATIONS

"Terbium Gallium Garnet—TGG", Northrop Grumman Synoptics, 2011, Charlotte, NC.

*Primary Examiner* — Nathan M Cors
(74) *Attorney, Agent, or Firm* — The Webb Law Firm

(57) ABSTRACT

An optical isolator includes a polarizer for receiving and passing an optical signal received from an optical signal source to a garnet which rotates a polarization of the optical signal by an angle of $45°-\theta_1°$, where $5°\leq\theta_1°<42°$, and outputs at least a part of this polarization rotated optical signal to an analyzer, having a polarization optical axis at $45°+\theta_2°$, where $5°\leq\theta_2°<42°$. The analyzer outputs at least a part of the polarization rotated optical signal to an external optical circuit which reflects at least a part of the polarization rotated optical signal back to the garnet via the analyzer. The garnet rotates a polarization of the reflected optical signal by an angle of $45°-\theta_1°$ and outputs this latter polarization rotated optical signal to the polarizer which at least partially blocks it from the optical signal source.

20 Claims, 5 Drawing Sheets

(56) References Cited

FOREIGN PATENT DOCUMENTS

| | | |
|---|---|---|
| JP | H7151996 A | 6/1995 |
| JP | 2002250897 A | 9/2002 |
| JP | 2005315906 A | 11/2005 |
| JP | 2008310068 A | 12/2008 |
| WO | 2012133200 A1 | 10/2012 |

* cited by examiner

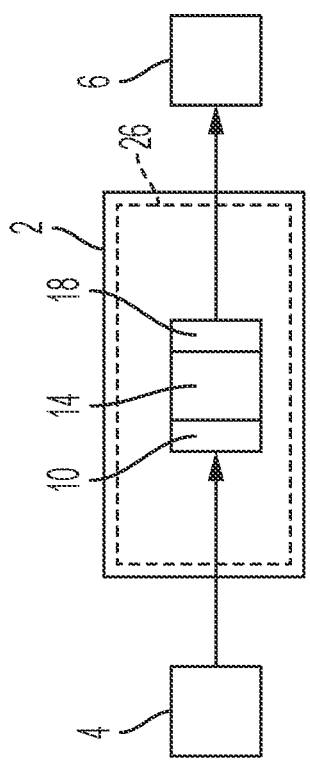
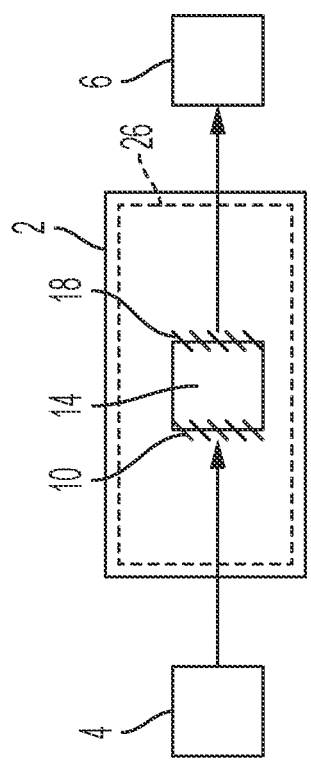
FIG. 1B
PRIOR ART
FIG. 1C
PRIOR ART

REDUCED THICKNESS OPTICAL ISOLATOR AND METHOD OF USE THEREOF IN A LASER OPTIC SYSTEM

BACKGROUND

1. Field

The present disclosure describes a reduced thickness optical isolator that may be used in a laser optical system to avoid or prevent unwanted feedback of optical signals to an optical signal (laser) source.

2. Description of Related Art

Figure 1A:
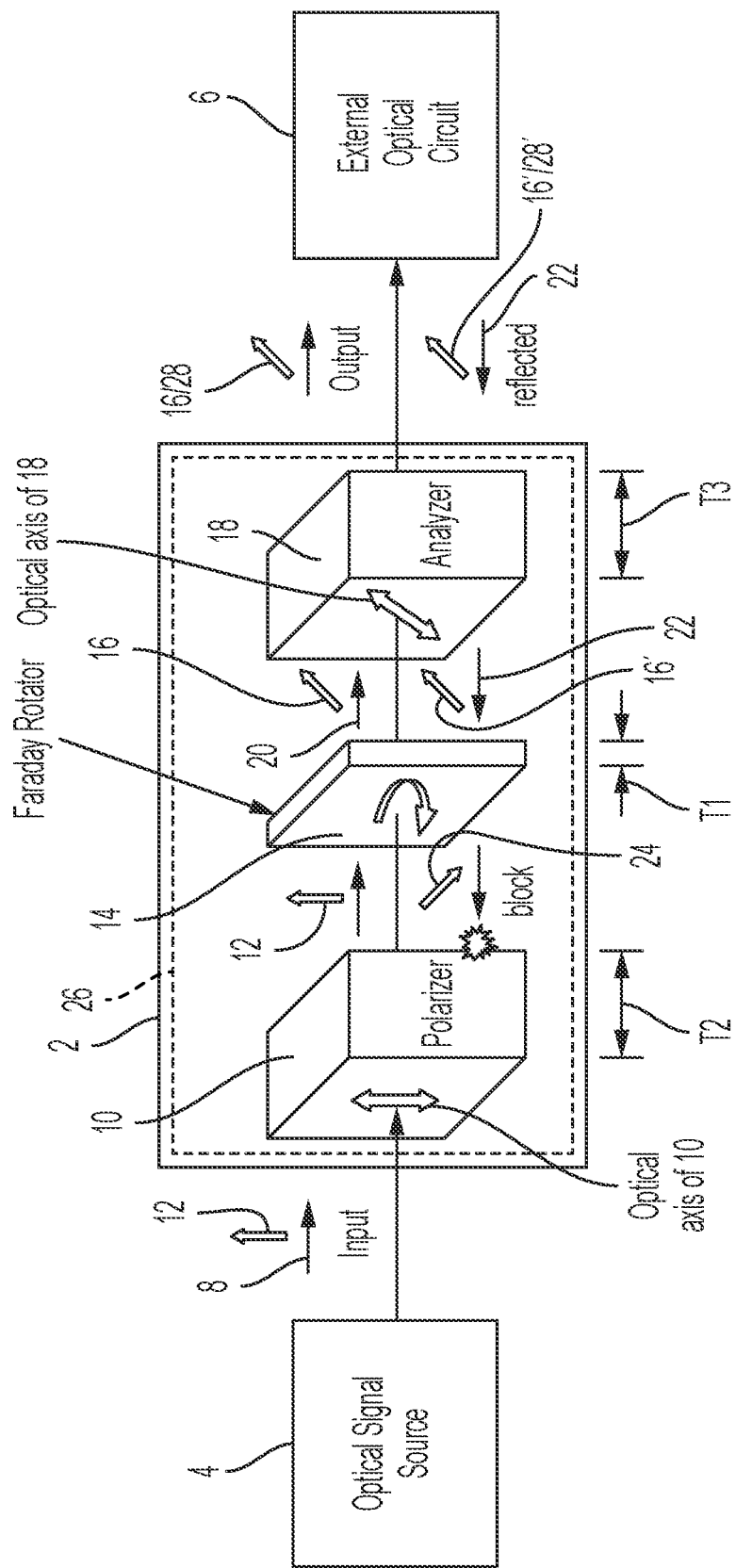

With reference to FIG. 1A, an optical isolator 2 is a device that allows unidirectional transmission of an optical signal. It is often used in optical systems, such as a laser optical system, to avoid unwanted optical reflections. For example, a laser 4, e.g., a laser diode, is sensitive to external optical feedback. Herein, "laser" may be referred to as an "optical signal source" and these terms may be used interchangeably.

Even a very low level of optical reflection from an external optical circuit 6, on the order of −20 dB to −50 dB, is sufficient to cause a significant increase in laser phase noise, intensity noise, and/or wavelength instability depending on the laser. Therefore the optical isolator 2 is usually required at the output of each laser 4 in applications that require low optical noise and stable optical frequency.

A optical isolator 2, an exploded view of which is shown in FIG. 1A, is based on a Faraday rotator or garnet 14 sandwiched between a first polarizer 10 and a second polarizer or analyzer 18, as shown in FIG. 1B. Herein, for the purpose of distinguishing the first polarizer from the second polarizer, the first polarizer 10 may be referred to as "polarizer 10" and the second polarizer or analyzer 18 may be referred to as "analyzer 18". An alternate embodiment optical isolator 2 may include garnet 14, as shown in FIG. 1C, which includes the polarizer 10 and analyzer 18 formed in respective first and second surfaces of the garnet 14, e.g., by one or more lithographic processes. The optical isolators 2 shown in FIGS. 1B and 1C function in the same manner.

In an example, the Faraday rotator or garnet 14 may be a bismuth iron garnet, a terbium gallium garnet, or an yttrium iron garnet. However, this is not to be construed in a limiting sense since the use of any other composition of matter, now known or hereinafter developed, that performs the same function as the garnet 14 described herein is envisioned.

Figure 2:
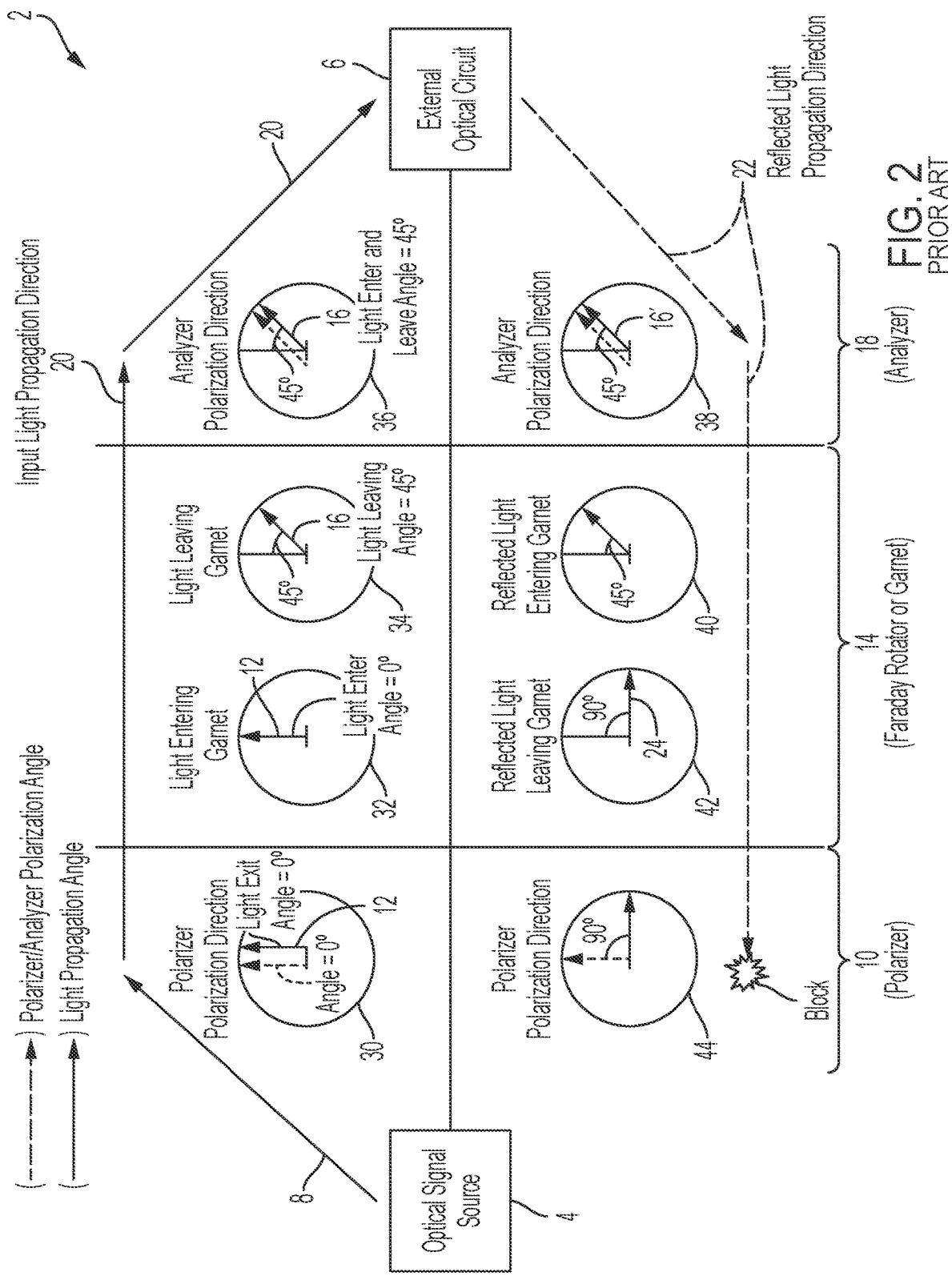

With reference to FIG. 2 and with continuing reference to FIG. 1A, regardless of the form of optical isolator 2 (shown in FIG. 1B or FIG. 1C) used, an input optical signal 8 coming directly from the laser 4 via an input optical medium, e.g., the ambient environment, an optical fiber, or any other suitable and/or desirable medium capable of passing the input optical signal 8, passes through polarizer 10 whose polarization axis or direction, in this example, is in the vertical direction or 0°, and which, in this example, matches the polarization 12 of the input optical signal 8 (see FIG. 2 reference number 30). As would be understood by one skilled in the art, if the primary direction of the polarization 12 of the input optical signal 8 does not match the polarization axis or direction of polarizer 10, the polarizer 10 will attenuate and pass to the garnet 14 that portion of the input optical signal 8 having a polarization that matches or substantially matches the polarization axis or direction of polarizer 10. That is, the polarizer 10 will block at least portions of the input optical signal having a polarization that do not match or substantially match the polarization axis or direction of the polarizer 10.

Then, garnet 14 rotates the polarization of the input optical signal 8 by, in this example, 45° in a clockwise direction (see FIG. 2 reference numbers 32 and 34). Depending upon its design, the garnet 14 may rotate the polarization of the input optical signal 8 clockwise or counterclockwise. The polarization rotated clockwise with respect to the direction of the input optical signal 8 is shown by reference number 16 in FIGS. 1A and 2 (see FIG. 2 reference number 34).

The amount of rotation of the input optical signal 8 by garnet 14 is based on the thickness T1 of garnet 14. In an example, depending on its properties, a garnet 14 having a thickness T1 of 310 μm operating with an input optical signal 8 having a wavelength of 1310 nm may rotate the polarization of the input optical signal 8 by 45°±3°. However, this example is not to be construed in a limiting sense since the materials and properties of the materials forming the garnet 14, the thickness T1 of the garnet 14 and the wavelength of the input optical signal 8 may be selected to achieve any desired amount of rotation of the polarization of the input optical signal 8. In an example, more or less rotation of the polarization of the input optical signal 8 by garnet 14 may be accomplished by use of garnet 14 having a greater or lesser thickness T1.

For the purpose of this description, it will be assumed that the garnet 14 rotates the polarization of an optical signal entering the garnet 14 from either side in a clockwise direction with respect to the direction of the input optical signal 8, i.e., from left to right in FIG. 1A. However, this is not to be construed in a limiting sense since it is envisioned that the garnet 14 may be designed to rotate the polarization of an optical signal entering the garnet 14 from either side in a counterclockwise direction with respect to the direction of the input optical signal 8.

The polarization axis or direction of analyzer 18 is, in this example, oriented 45° clockwise with respect to the direction of the input optical signal 8, which allows the optical signal 20 from the garnet 14, the polarization of which was rotated 45° by the garnet 14, to pass through the analyzer 18 directly to the external optical circuit 6 via an output optical medium with little attenuation (see FIG. 2 reference number 36). The output optical medium may be the ambient environment, an optical fiber, or any other suitable and/or desirable medium capable of passing the input optical signal. The input and output optical mediums may be the same or different.

If there is a reflection from the external optical circuit 6 on the right side in FIG. 1A, that portion of the reflected optical signal 22 which includes a polarization state 16' of 45° will pass through the analyzer 18 and the garnet 14 from right to left in FIG. 1A with little attenuation (see FIG. 2 reference numbers 38 and 40). As would be understood by one skilled in the art, the reflected optical signal 22 includes polarization states in addition to polarization state 16' of 45°. Herein, the terms "polarization" and "polarization state" may be used interchangeably. Since the garnet 14 is a nonreciprocal device, the polarization of the reflected optical signal 22 will, in this example, rotate for an additional 45° in the same direction as the input optical signal 8, thus becoming perpendicular, i.e., 90°, to the polarization axis or direction of the polarizer 10 (see FIG. 2 reference number 42). This rotated polarization is shown by reference number 24 in FIGS. 1A and 2.

In this way, the polarizer 10 effectively blocks the reflected optical signal 22 (see FIG. 2 reference number 44)

and helps assure the unidirectional transmission of optical signal 8 input into the optical isolator 2.

The specific angles of light polarizations 12, 16, 16' and 24 and the specific angles of the optical axes of polarizer 10 and analyzer 18 discussed above are found in optical isolators 2 prior to the present disclosure.

For a garnet 14 of a certain thickness, the angle of polarization rotation versus an intensity of an optional external magnetic field that may be applied to the garnet is generally not linear.

Therefore, when a magnet 26 (shown in phantom in FIGS. 1A-1C) is used to apply an optional external magnetic field, a magnetic field strength of sufficient strength, as is known in the art, may be used to facilitate a stable rotation angle when the garnet thickness T1 is defined. The value of isolation is largely determined by the accuracy of the polarization rotation angle and thus by the thickness T1 of garnet 14.

In a non-limiting example, for an optical signal having a wavelength of 1310 nm, the thickness T1 of the garnet 14 may be about 310 μm±1 μm or ±5 μm and the thicknesses T2 and T3 of polarizer 10 and analyzer 18, of the type shown in FIG. 1B, may be each about 300 μm±1 μm or ±5 μm. Thus, the sum of thickness T1, T2, and T3 of the typical optical isolator 2, shown in FIG. 1B, used with a wavelength of 1310 nm may run about 910 μm±3 μm or ±15 μm.

The external magnetic field applied to the garnet 14 aligns its magnetic domains which enables the garnet to rotate the polarization of the input and reflected optical signals 8 and 22 in the manner described above. While a magnet 26 is often used to align the magnetic domains of the garnet 14, the use in optical isolator 2 of a garnet 14 having its magnetic domains permanently aligned without the need for an externally applied magnetic field, i.e., without the use of the magnet 26 of optical isolator 2, is also envisioned. This latter garnet is often called "self-latching".

In practice, and as would be understood by one skilled in the art, an optical signal exiting the polarizer 10 in either direction, i.e., exiting toward the garnet 14 or exiting toward the laser 4, includes polarizations in addition to the polarization corresponding to the polarization axis or direction of the polarizer 10, albeit at reduced intensity over the optical signal having a polarization that matches the polarization axis or direction of the polarizer 10. Similarly, an optical signal exiting the analyzer 18 from either direction, i.e., exiting toward the external optical circuit 6 or exiting toward the garnet 14, includes polarizations in addition to the polarization corresponding to the polarization axis or direction of the analyzer 18, albeit at reduced intensity over the optical signal having a polarization that matches the polarization axis or direction of the analyzer 18.

The material(s) used to form the polarizer 10 and/or how the polarizer 10 is manufactured or formed may influence and/or affect the amount and/or intensity of the optical signal that exits the polarizer 10 that includes polarizations that do not match the polarization axis or direction of the polarizer 10. Similarly, the material(s) used to form the analyzer 18 and/or how the analyzer 18 is manufactured or formed may influence and/or affect the amount and/or intensity of the optical signal that exits the analyzer 18 that includes polarizations that do not match the polarization axis or direction of the analyzer 18. Accordingly, it is to be understood herein, that an optical signal exiting the polarizer 10 or analyzer 18 in either direction includes polarizations in addition to the polarization corresponding to the polarization axis or direction of the respective polarizer 10 or analyzer 18, albeit at reduced intensity over the optical signal having a polarization that matches the polarization axis or direction of the respective polarizer 10 or analyzer 18.

An optical isolator 2 used with a wavelength of 1310 nm and having a total thickness that runs about 910 μm±3 μm or ±15 μm, like the optical isolator 2 shown in FIG. 1B, may be too thick for certain applications, such as handheld devices incorporating a semiconductor laser.

Indeed, even an optical isolator 2, like the one shown in FIG. 1C which includes the polarizer 10 and analyzer 18 formed in respective first and second surfaces or faces of the garnet 14 and which may have a total thickness corresponding to the thickness T1 of the garnet 14, e.g., 310 μm±1 μm or ±5 μm, may be too thick for applications such a handheld devices incorporating a semiconductor laser.

It would therefore be desirable to provide a reduced thickness or thinner optical isolator 2 for use in such applications that maintained that same level of optical isolation as the optical isolators 2 shown in FIGS. 1A, 1B, 1C and 2, even at the tradeoff of increased insertion loss which may be acceptable in such applications.

SUMMARY

Disclosed herein is a method of optically isolating an optical signal source from an external optical circuit. The method includes: a) receiving at a polarizer, having a first polarization axis or direction, an optical signal from an optical signal source, the polarizer outputting at least a part of the optical signal received at the polarizer; b) receiving in a body of a garnet directly from the polarizer the at least part of the optical signal output by the polarizer in step a), the garnet rotating, with respect to the first polarization axis or direction, a polarization of the at least part of the optical signal output by the polarizer in step a) by an angle of $45°-\theta_1°$ and outputting at least a part of the polarization rotated optical signal of this step b), wherein $5° \leq \theta_1° < 42°$; c) receiving at an analyzer, having a second polarization axis or direction at $45°+\theta_2°$ with respect to the first polarization axis or direction, directly from the garnet the part of the polarization rotated optical signal output by the garnet in step b), the analyzer outputting at least a part of the optical signal received from the garnet in this step c) directly to an external optical circuit, wherein $5° \leq \theta_2° < 42°$; d) receiving at the analyzer directly from the external optical circuit a reflection of at least a part of the optical signal output by the analyzer in step c), the analyzer outputting at least a part of the reflected optical signal; e) receiving in the body of the garnet directly from the analyzer the at least a part of the reflected optical signal output by the analyzer in step d), the garnet rotating, with respect to the first polarization axis or direction, a polarization of the part of the reflected optical signal output by the analyzer in step d) by an angle of $45°-\theta_1°$ in the same direction as the polarization rotation in step b) and outputting at least a part of the polarization rotated reflected optical signal of this step e); and f) receiving at the polarizer, having the first polarization axis or direction, directly from the garnet the polarization rotated optical signal of step e), the polarizer blocking ≥25 dB of the polarization rotated optical signal received from the garnet.

Also disclosed is an optical isolator for isolating an optical signal source from an external optical circuit. The optical isolator includes: a polarizer, having a first polarization axis or direction, for directly receiving an optical signal from an optical signal source and for outputting at least a part of the optical signal; a garnet for directly receiving and for rotating a polarization of the at least part of the optical signal output by the polarizer by an angle of $45°-\theta_1°$, with respect to the first polarization axis or direction, and for outputting at least a part thereof as a first garnet output optical signal, wherein $5°≤θ_1°<42°$; and an analyzer, having a second polarization axis or direction at $45°+θ_2°$ with respect to the first polarization axis or direction, for directly receiving the first garnet output optical signal and for outputting at least a part thereof directly to an external optical circuit as a first analyzer optical signal, wherein $5°≤θ_2°<42°$; wherein: the analyzer directly receives from the external optical circuit a reflection of at least a part of the first analyzer output optical signal and outputs directly to the garnet at least part of the reflection of the at least a part of the first analyzer output optical signal as a second analyzer output optical signal; the garnet directly receives and rotates a polarization of the second analyzer output optical signal, with respect to the first polarization axis or direction, by an angle of $45°−θ_1°$ in the same direction as the rotation by the garnet of the polarization of the at least part of the optical signal received by the garnet from the polarizer and outputs at least a part thereof to the polarizer as a second garnet output optical signal; and the polarizer blocks ≥25 dB of the second garnet output optical signal received by the polarizer from the garnet.

BRIEF DESCRIPTION OF THE DRAWING(S)

Figure 3:
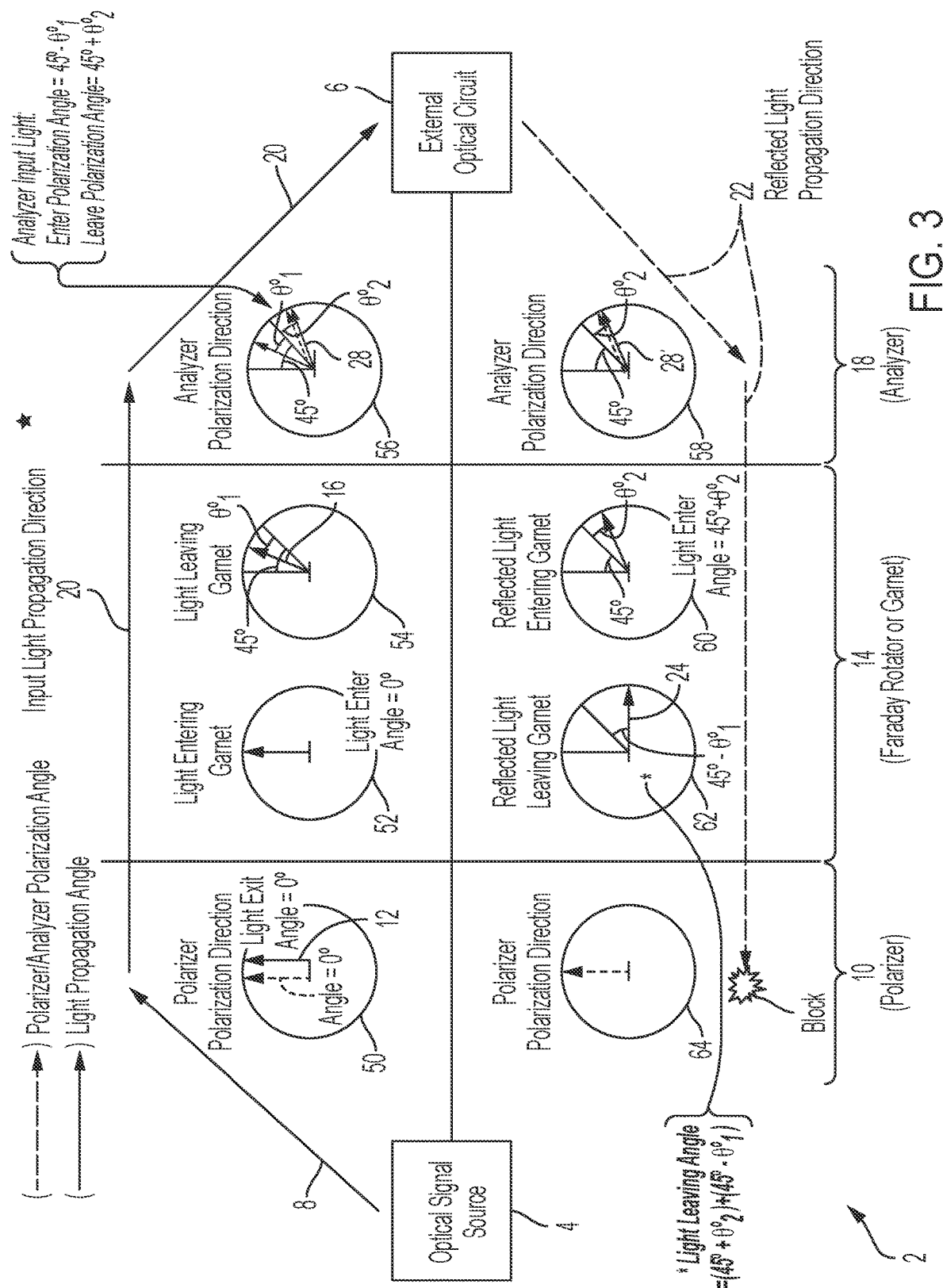
Figure 4:
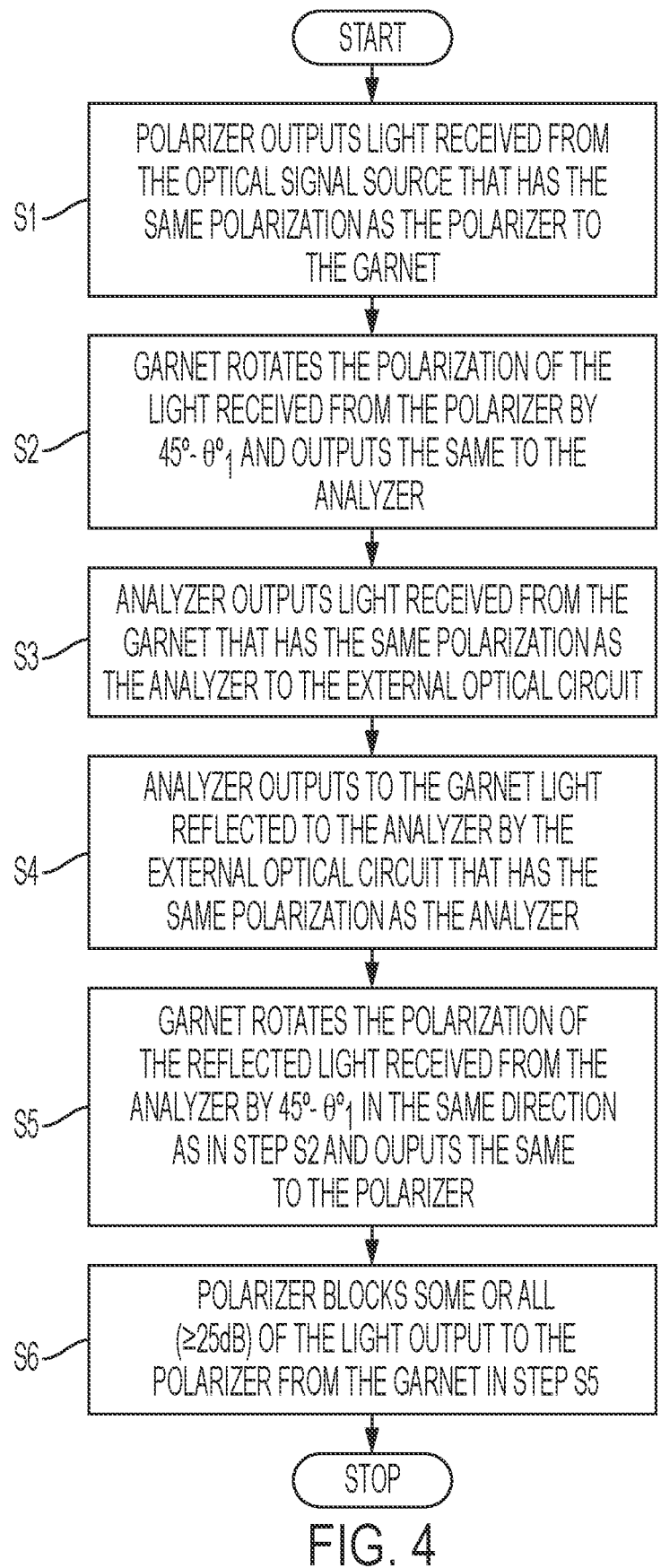

FIG. 1A is an exploded diagrammatic perspective view of an optical isolator that includes, from left to right, a polarizer, a garnet, and an analyzer, wherein the polarizer is optically connected or coupled to an optical signal source, e.g., a laser, on the left and the analyzer is optically connected or coupled to an external optical circuit on the right;

FIG. 1B is a diagrammatic assembled view of the optical isolator shown in FIG. 1A connected or coupled to the optical signal source on the left and connected or coupled to the external optical circuit on the right, wherein, in one non-limiting example, the polarizer, the garnet, and the analyzer are separate elements, and the polarizer and analyzer are coupled to first and second faces of the garnet;

FIG. 1C is a diagrammatic assembled view of the optical isolator shown in FIG. 1A connected or coupled to the optical signal source on the left and connected or coupled to the external optical circuit on the right, wherein the polarizer and analyzer are formed in respective first and second surfaces or faces of the garnet, e.g., by one or more lithographic processes;

FIG. 2 is a schematic of the optical isolator shown in FIG. 1A illustrating polarization angles of the polarizer and the analyzer, illustrating how the polarization of light from the optical signal source changes as it propagates (from left to right) through the garnet, illustrating how the polarization of light reflected from the external optical circuit source changes as it propagates (from right to left) through the garnet, and how further propagation of some or all of the light reflected from the external optical is blocked by the polarizer;

FIG. 3 is a schematic of an optical isolator in accordance with the principles of the present disclosure illustrating polarization angles of the polarizer and the analyzer, illustrating how the polarization of light from the optical signal source changes as it propagates (from left to right) through the garnet, illustrating how the polarization of light reflected from the external optical circuit source changes as it propagates (from right to left) through the garnet, and how further propagation of some or all of the light reflected from the external optical is blocked by the polarizer; and FIG. 4 is a flow diagram of a method of optically isolating an optical signal source from an external optical circuit isolator in accordance with the principles of the present disclosure.

DESCRIPTION

Various non-limiting examples will now be described with reference to the accompanying figures where like reference numbers correspond to like or functionally equivalent elements.

For purposes of the description hereinafter, terms like "end," "upper," "lower," "right," "left," "vertical," "horizontal," "top," "bottom," "lateral," "longitudinal," and derivatives thereof shall relate to the example(s) as oriented in the drawing figures. However, it is to be understood that the example(s) may assume various alternative variations and step sequences, except where expressly specified to the contrary. It is also to be understood that the specific example (s) illustrated in the attached drawings, and described in the following specification, are simply exemplary examples or aspects of the disclosure. Hence, the specific examples or aspects disclosed herein are not to be construed as limiting.

With reference to FIGS. 1A and 3, in use of an optical isolator 2 (of the type shown in FIG. 1B or 1C in accordance with the principles of the present disclosure, the input optical signal 8 coming from the laser 4 via an input optical medium passes through polarizer 10 whose polarization axis or direction, in this example, is in the vertical direction or 0°, and which, in this example, matches the polarization 12 of the input optical signal 8 (see FIG. 3 reference number 50).

Each of the various optical signals discussed herein will be described as having a polarization which is a primary polarization direction of the optical signal. As would be understood by one skilled in the art, each of the optical signals discussed herein may also include one or more secondary polarization directions, albeit of reduced intensity, in addition to the primary polarization direction. These secondary polarization directions may not be specifically discussed or described herein for the purpose of simplicity.

Next, garnet 14 rotates the polarization of the input optical signal 8 by $45°−θ_1°$, where $5°≤θ_1°<42°$, in a clockwise direction (see FIG. 3 reference numbers 52 and 54). Depending upon its design, the garnet 14 may rotate the polarization of the input optical signal 8 clockwise or counterclockwise. The polarization rotated clockwise with respect to the direction of propagation of the input optical signal 8 is shown by reference number 16 in FIGS. 1A and 3 (see FIG. 3 reference number 54).

The amount of rotation of the input optical signal 8 by garnet 14 is based on the properties and the thickness T1 of garnet 14. To this end, the rotation of the input optical signal 8 (or a reflected optical signal 22, discussed hereinafter) by garnet 14 scales linearly with respect to the thickness T1 of garnet 14. For example, a garnet 14 having a thickness T1 of 310 μm operating with an input optical signal 8 having a wavelength of 1310 nm may rotate the polarization of the input optical signal 8 by 45°±3°; a garnet 14 having a thickness T1 of 155 μm operating with an input optical signal 8 having a wavelength of 1310 nm may rotate the polarization of the input optical signal 8 by 22.5°±3°; a garnet 14 having a thickness T1 of 77.5 μm operating with an input optical signal 8 having a wavelength of 1310 nm may rotate the polarization of the input optical signal 8 by 11.25°±3°; and so forth.

For the purpose of this description, it will be assumed that the garnet 14 rotates the polarization of an optical signal entering the garnet 14 from either side in a clockwise direction with respect to the direction of propagation of the input optical signal 8, i.e., from left to right in FIG. 1A. However, this is not to be construed in a limiting sense since it is envisioned that the garnet 14 may be designed to rotate the polarization of an optical signal entering the garnet 14 from either direction in a counterclockwise direction with respect to the direction of propagation of the input optical signal 8.

The polarization axis or direction of analyzer 18 is, in this example, oriented $45°+\theta_2°$, where $5°\leq\theta_2°<42°$, clockwise with respect to the direction of propagation of the input optical signal 8. Because the optical signal 20 leaving garnet 14 (and entering analyzer 18) has a polarization of $45°-\theta_1°$ and because the analyzer 18 has a polarization optical axis or direction oriented $45°+\theta_2°$, the optical signal 20 passing through analyzer 18 will experience attenuation or insertion loss to a degree related to the difference in the polarizations of the optical signal 20 entering and leaving analyzer 18. To this end, the portion 28 of the optical signal 20 having a polarization optical axis or direction oriented at $45°+\theta_2°$ will exit analyzer 18 (see FIG. 3 reference number 56).

If there is a reflection of the optical signal 20 from the external optical circuit 6 on the right side in FIGS. 1A and 3, the reflected optical signal 22, which includes a polarization state 28' of $45°+\theta_2°$, the same as the rotated polarization 28 of the optical signal 20 exiting analyzer 18, will pass through the analyzer 18 and the garnet 14 from right to left in FIG. 1A with little attenuation (see FIG. 3 reference numbers 58, 60 and 62). Since the garnet 14 is a nonreciprocal device, the polarization state of the reflected optical signal 22 will rotate for an additional $45°-\theta_1°$ clockwise with respect to the direction of propagation of the input optical signal 8, whereupon the polarization state of the reflected optical signal 22 exiting garnet 14 will have a total rotation of $(45°+\theta_2°)+(45°-\theta_1°)$. In one non-limiting example, the polarization state of the reflected optical signal 22 exiting garnet 14 (shown by reference number 24 in FIGS. 1A and 3) may be transverse or perpendicular, i.e., 90°, to the polarization axis or direction of the polarizer 10, whereupon the polarizer 10 effectively blocks the reflected optical signal from reaching the laser 4 (see FIG. 3 reference numbers 62 and 64). However, this is not to be construed in a limiting sense since it is envisioned that the polarization state of the reflected optical signal 22 exiting garnet 14 (shown by reference number 24 in FIGS. 1A and 3) may be at any angle, deemed suitable and/or desirable by one skilled in the art for a particular application, with respect to the polarization axis or direction of the polarizer 10. As would be understood by one skilled in the art, the polarizer 10 may allow optical signals from the garnet 14 having secondary polarizations. i.e., polarizations other than the primary polarization of the reflected optical signal 22 exiting garnet 14 (shown by reference number 24 in FIGS. 1A and 3) to pass through to the laser 4, albeit at a reduced intensity that is insufficient to cause a significant increase in laser phase noise, intensity noise, and/or wavelength instability of the laser 4.

Having thus described a general example of an optical isolator 2 in accordance with the principles of the present disclosure, a specific non-limiting example will now be described with reference to FIGS. 1A and 3.

The input optical signal 8 coming from laser 4 via an input optical medium passes through polarizer 10 whose polarization axis or direction, in this example, is in the vertical direction or 0°, and which, in this example, matches the polarization 12 of the input optical signal 8 (see FIG. 3 reference number 50).

Then, garnet 14 rotates the polarization state of the input optical signal 8 by 22.5° (i.e., $45°-\theta_1°$; where $\theta_1°=22.5°$) in a clockwise direction. This rotation is shown by reference numbers 12 and 16 (see FIG. 3 reference numbers 52 and 54). In this example, garnet 14 has a thickness T1 of 155 μm which, when used with an input optical signal 8 having a wavelength of 1310 nm, may rotate the polarization of the input optical signal 8 by 22.5°±3°.

The polarization axis or direction of analyzer 18, in this example, is oriented 67.5° (i.e., $45°+\theta_2°$; where $\theta_2°=22.5°$) clockwise with respect to the direction of the input optical signal 8. Because the optical signal 20 leaving garnet 14 has a polarization of 22.5° and because the analyzer 18 has a polarization optical axis or direction oriented 67.5°, the optical signal 20 passing through analyzer 18 will experience attenuation or insertion loss to a degree related to the difference in the polarization of the optical signal 20 leaving garnet 14 and the polarization optical axis or direction of analyzer 18, in this example, this difference is 45°. To this end, the portion(s) 28 of the optical signal 20 leaving garnet 14, having an optical axis or direction oriented at 67.5°, e.g., one or more secondary polarizations, will exit analyzer 18 (see FIG. 3 reference number 56).

If there is a reflection of the optical signal 20 from the external optical circuit 6 on the right side in FIG. 1A, the reflected optical signal 22, which includes a polarization state 28' of 67.5°, the same as the polarization 28 of the optical signal 20 exiting analyzer 18, will pass through the analyzer 18 and the garnet 14 from right to left in FIG. 1A with little attenuation (see FIG. 3 reference numbers 58, 60 and 62). Since the garnet 14 is a nonreciprocal device, the polarization state of the reflected optical signal 22 will rotate for an additional 22.5° clockwise with respect to the direction of the propagation of the input optical signal 8, whereupon the polarization state of the reflected optical signal 22 exiting garnet 14 will have a total rotation of $(45°+\theta_2°)+(45°-\theta_1°)$. In this example, the polarization state of the reflected optical signal 22 exiting garnet 14 (shown by reference number 24 in FIGS. 1A and 3) is perpendicular, i.e., 90°, to the polarization axis or direction of the polarizer 10, whereupon the polarizer 10 effectively blocks the reflected optical signal from reaching the laser 4 (see FIG. 3 reference numbers 62 and 64). However, this is not to be construed in a limiting sense since it is envisioned that polarization state of the reflected optical signal 22 exiting garnet 14 (shown by reference number 24 in FIGS. 1A and 3) may be at any angle, deemed suitable and/or desirable by one skilled in the art for a particular application, with respect to the polarization axis or direction of the polarizer 10. Moreover, as would be understood by one skilled in the art, the polarizer 10 may allow optical signals from the garnet 14 having secondary polarizations, i.e., polarizations other than the primary polarization of the reflected optical signal 22 exiting garnet 14 (shown by reference number 24 in FIGS. 1A and 3) to pass through to the laser 4, albeit at an reduced intensity that is insufficient to cause a significant increase in laser phase noise, intensity noise, and/or wavelength instability of the laser 4.

With reference to FIG. 4, a method of optically isolating an optical signal source or laser 4 from an external optical circuit includes, advancing from the Start step, step S1 where polarizer 10 outputs to the garnet 14 light received from the optical signal source or laser 4 that has the same polarization as the polarization axis or direction as the polarizer 10. However, light from the optical signal source or laser 4 output by the polarizer 10 may include additional, secondary polarizations, albeit at a reduced intensity.

In step S2, the garnet 14 rotates the polarization of the light received from the polarizer by $45°-\theta_1°$ (e.g., 22.5°), where $5°\le\theta_1°<42°$ and outputs the same to the analyzer 18.

In step S3, the analyzer 18 outputs light received from the garnet 14 that has the same polarization as the polarization axis or direction (e.g., $45°+\theta_2°$ (e.g., 67.5°), where $5°\le\theta_2°<42°$) as the analyzer 18 to the external optical circuit 6.

In step S4, the analyzer 18 outputs to the garnet 14 light reflected by the external optical circuit 6 that has the same polarization axis or direction as the analyzer 18.

In step S5, the garnet 14 rotates the polarization of the reflected light received from the analyzer 18 by $45°-\theta_1°$ in the same direction as in step S2 and outputs the same to the polarizer 10.

Finally, in step S6 the polarizer 10 blocks some or all, e.g., ≥25 dB, ≥50 dB, or ≥60 dB, of the light output to the polarizer 10 from the garnet 14 in step S5. From step S6, the method advances to the Stop step.

Thus, as can be seen, an optical isolator 2 made with garnet 14 of thickness T1 less than in the prior art can be used to obtain a desired degree of optical isolation. e.g., the polarizer 10 may block ≥25 dB, ≥50 dB, or ≥60 dB of the reflected optical signal 22 received from the garnet 14, at the tradeoff of increased insertion loss, which insertion loss may occur as the input optical signal 8 passes through one or more of the polarizer 10, the garnet 14, and/or the analyzer 18, especially the analyzer 18.

In one non-limiting example, when used with input optical signal 8 having a wavelength of 1310 nm, an optical isolator 2 in accordance with the principles of the present disclosure shown in FIGS. 1A and 4 may, according to the example optical isolator 2 shown in FIG. 1B, have a total thickness of 755 μm±15 μm, where the thickness T1 of the garnet 14=155 μm±5 μm and the thickness T2 of the polarizer 10=the thickness T3 of the analyzer 18=300 μm±5 μm. In another non-limiting example, when used with input optical signal 8 having a wavelength of 1310 nm an optical isolator 2 in accordance with the principles of the present disclosure shown in FIGS. 1A and 4 may, according to the example optical isolator 2 shown in FIG. 1C, have a total thickness of 155 μm±5 μm, i.e., the thickness of the garnet 14 which includes the polarizer 10 and analyzer 18 formed in respective first and second surfaces of the garnet 14. e.g., by one or more lithographic processes. However, these examples are not to be construed as limiting since the total thickness of an optical isolator 2 in accordance with the principles of the present disclosure may be selected for a particular application as a tradeoff between desired insertion loss and desired optical isolation.

Finally, the various ranges of angles described herein are not to be construed as limiting. For example, the range of $\theta_1°$ may be $5°\le\theta_1°<42°$; $15°\le\theta_1°\le30°$; or less and/or the range of $\theta_2°$ may be $5°\le\theta_2°<42°$; $15°\le\theta_2°\le30°$; or less. Moreover, angles $\theta_1°$ and $\theta_2°$ may be different or the same.

Although the disclosure has been described in detail for the purpose of illustration based on what is currently considered to be the most practical and preferred embodiments, it is to be understood that such detail is solely for that purpose and that the disclosure is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

The invention claimed is:

1. A method of optically isolating an optical signal source from an external optical circuit, the method comprising:
   a) receiving at a polarizer, having a first polarization optical axis, an optical signal from an optical signal source, the polarizer outputting at least a part of the optical signal received at the polarizer;
   b) receiving in a body of a garnet directly from the polarizer the at least part of the optical signal output by the polarizer in step a), the garnet rotating, with respect to the first polarization optical axis, a polarization of the at least part of the optical signal output by the polarizer in step a) by an angle of $45°-\theta_1°$ and outputting at least a part of the polarization rotated optical signal of this step b), wherein $5°\le\theta_1°<42°$;
   c) receiving at an analyzer, having a second polarization optical axis at $45°+\theta_2°$ with respect to the first polarization optical axis, directly from the garnet the part of the polarization rotated optical signal output by the garnet in step b), the analyzer outputting at least a part of the optical signal received from the garnet in this step c) directly to an external optical circuit, wherein $5°\le\theta_2°<42°$;
   d) receiving at the analyzer directly from the external optical circuit a reflection of at least a part of the optical signal output by the analyzer in step c), the analyzer outputting at least a part of the reflected optical signal;
   e) receiving in the body of the garnet directly from the analyzer the at least a part of the reflected optical signal output by the analyzer in step d), the garnet rotating, with respect to the first polarization optical axis, a polarization of the part of the reflected optical signal output by the analyzer in step d) by an angle of $45°-\theta_1°$ in the same direction as the polarization rotation in step b) and outputting at least a part of the polarization rotated reflected optical signal of this step e); and
   f) receiving at the polarizer, having the first polarization optical axis, directly from the garnet the polarization rotated optical signal of step e), the polarizer blocking ≥25 dB of the polarization rotated optical signal received from the garnet.

2. The method of claim 1, wherein:
   the first polarization optical axis has a polarization of 0°; and
   $\theta_1°=\theta_2°=22.5°$.

3. The method of claim 1, wherein:
   $15°\le\theta_1°\le30°$; and
   $15°\le\theta_2°\le30°$.

4. The method of claim 1, wherein the first and second polarization optical axes are at an angle between 40° and 50° degrees to each other.

5. The method of claim 1, wherein a polarization of the optical signal from the optical signal source and a polarization of the first polarization optical axis of the polarizer are the same.

6. The method of claim 1, wherein magnetic domains of the garnet are aligned without the application of a externally applied magnetic field to the garnet.

7. The method of claim 1, wherein magnetic domains of the garnet are aligned under the influence of a magnetic field applied to the garnet by a permanent magnet.

8. The method of claim 1, wherein:
   the polarizer is attached to a first surface of the garnet; and
   the analyzer is attached to a second surface of the garnet.

9. The method of claim 1, wherein:
the polarizer is formed in a first surface of the garnet; and
the analyzer is formed in a second surface of the garnet.

10. The method of claim 1, wherein the garnet is one of the following:
a bismuth iron garnet;
a terbium gallium garnet; or
a yttrium iron garnet.

11. An optical isolator for isolating an optical signal source from an external optical circuit, the optical isolator comprising:
a polarizer, having a first polarization optical axis, for directly receiving an optical signal from an optical signal source and for outputting at least a part of the optical signal;
a garnet for directly receiving and for rotating a polarization of the at least part of the optical signal output by the polarizer by an angle of $45°-\theta_1°$, with respect to the first polarization optical axis, and for outputting at least a part thereof as a first garnet output optical signal, wherein $5°\leq\theta_1°<42°$; and
an analyzer, having a second polarization optical axis at $45°+\theta_2°$ with respect to the first polarization optical axis, for directly receiving the first garnet output optical signal and for outputting at least a part thereof directly to an external optical circuit as a first analyzer optical signal, wherein $5°\leq\theta_2°<42°$;
wherein:
the analyzer directly receives from the external optical circuit a reflection of at least a part of the first analyzer output optical signal and outputs directly to the garnet at least part of the reflection of the at least part of the first analyzer output optical signal as a second analyzer output optical signal;
the garnet directly receives and rotates a polarization of the second analyzer output optical signal, with respect to the first polarization optical axis, by an angle of $45°-\theta_1°$ in the same direction as the rotation by the garnet of the polarization of the at least part of the optical signal received by the garnet from the polarizer and outputs at least a part thereof to the polarizer as a second garnet output optical signal; and
the polarizer blocks ≥25 dB of the second garnet output optical signal received by the polarizer from the garnet.

12. The optical isolator of claim 11, wherein:
the first polarization optical axis has a polarization of 0°; and
$\theta_1°=\theta_2°=22.5°$.

13. The optical isolator of claim 11, wherein:
$15°\leq\theta_1°\leq30°$; and
$15\leq\theta_2°\leq30°$.

14. The optical isolator of claim 11, wherein the first and second polarization optical axes are at an angle between 40° and 50° degrees to each other.

15. The optical isolator of claim 11, wherein a polarization of the optical signal from the optical signal source and a polarization of the first polarization optical axis of the polarizer are the same.

16. The optical isolator of claim 11, wherein magnetic domains of the garnet are aligned without the application of a externally applied magnetic field to the garnet.

17. The optical isolator of claim 11, further including a permanent magnet positioned to align magnetic domains of the garnet under the influence of a magnetic field applied to the garnet by the permanent magnet.

18. The optical isolator of claim 11, wherein:
the polarizer is attached to a first surface of the garnet; and
the analyzer is attached to a second surface of the garnet.

19. The optical isolator of claim 11, wherein:
the polarizer is formed in a first surface of the garnet; and
the analyzer is formed in a second surface of the garnet.

20. The optical isolator of claim 11, wherein the garnet is one of the following:
a bismuth iron garnet;
a terbium gallium garnet; or
a yttrium iron garnet.

* * * * *